(12) United States Patent
Xie et al.

(10) Patent No.: US 12,113,067 B2
(45) Date of Patent: Oct. 8, 2024

(54) FORMING N-TYPE AND P-TYPE HORIZONTAL GATE-ALL-AROUND DEVICES

(71) Applicant: International Business Machines Corporation, Armonk, NY (US)

(72) Inventors: Ruilong Xie, Niskayuna, NY (US); Kangguo Cheng, Schenectady, NY (US); Juntao Li, Cohoes, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 17/472,759

(22) Filed: Sep. 13, 2021

(65) Prior Publication Data

US 2023/0079751 A1    Mar. 16, 2023

(51) Int. Cl.
*H01L 21/82* (2006.01)
*H01L 21/8238* (2006.01)
*H01L 27/092* (2006.01)

(52) U.S. Cl.
CPC .... *H01L 27/092* (2013.01); *H01L 21/823807* (2013.01)

(58) Field of Classification Search
CPC .......... H01L 27/092; H01L 21/823807; H01L 29/0673; H01L 29/42392; H01L 29/66439; H01L 29/66545; H01L 29/775; H01L 29/78696; B82Y 10/00
USPC ...................................................... 257/369
See application file for complete search history.

(56) References Cited

U.S. PATENT DOCUMENTS

| | | | | |
|---|---|---|---|---|
| 8,829,625 | B2 * | 9/2014 | Sleight | H01L 29/775 |
| | | | | 257/E29.245 |
| 9,214,567 | B2 * | 12/2015 | Cheng | H01L 23/5256 |
| 9,991,352 | B1 * | 6/2018 | Frougier | H01L 29/42364 |
| 10,014,390 | B1 * | 7/2018 | Bouche | H01L 29/78696 |
| 10,056,454 | B2 | 8/2018 | Kim | |
| 10,074,575 | B1 | 9/2018 | Guillorn | |
| 10,141,320 | B1 * | 11/2018 | Cheng | H01L 23/573 |
| 10,141,403 | B1 * | 11/2018 | Cheng | H01L 29/0673 |
| 10,217,816 | B2 * | 2/2019 | Bhuwalka | H01L 29/66545 |

(Continued)

FOREIGN PATENT DOCUMENTS

WO    2019112954 A1    6/2019

OTHER PUBLICATIONS

R. Bao et al., "Selective Enablement of Dual Dipoles for Near Bandedge Multi-Vt Solution in High Performance FinFET and Nanosheet Technologies," Symposium on VLSI Technology, Digest of Technical Papers—978-1-7281-6460 © IEEE 2000, TC3.2, 2020, 2 Pgs.

*Primary Examiner* — Vu A Vu
(74) *Attorney, Agent, or Firm* — Edward J. Wixted, III

(57) ABSTRACT

An approach provides a semiconductor structure for a first device with a first plurality of channels with a larger horizontal dimension than a vertical dimension of the first plurality of channels a second device comprising a second plurality of channels with a smaller horizontal dimension than the vertical dimension of the second plurality of channels. The first plurality of channels and the second plurality of channels have a same channel width in embodiments of the present invention. The first device is an n-type horizontal gate-all-around device and the second device is a p-type horizontal gate-all-around device.

18 Claims, 11 Drawing Sheets

(56) References Cited

U.S. PATENT DOCUMENTS

| | | |
|---|---|---|
| 10,319,846 B1 | 6/2019 | Ando |
| 10,332,803 B1 | 6/2019 | Ruilong |
| 10,431,663 B2 | 10/2019 | Xie |
| 10,685,887 B2 * | 6/2020 | Smith .................. H01L 27/092 |
| 10,892,328 B2 * | 1/2021 | Song ................. H01L 29/78696 |
| 11,101,359 B2 * | 8/2021 | Wu ................. H01L 21/823418 |
| 2019/0035913 A1 | 1/2019 | Cheng |
| 2019/0287864 A1 | 9/2019 | Cheng |
| 2019/0341450 A1 | 11/2019 | Lee |
| 2020/0066839 A1 * | 2/2020 | Zhang ............. H01L 21/823412 |
| 2020/0083221 A1 | 3/2020 | Ando |

* cited by examiner

FORMING N-TYPE AND P-TYPE HORIZONTAL GATE-ALL-AROUND DEVICES

BACKGROUND OF THE INVENTION

The present invention relates generally to the field of semiconductor device formation and particularly to the formation of N-type and P-type complementary metal-oxide-semiconductor (CMOS) transistors using gate-all-around (GAA) channels.

Semiconductor device fabrication is a series of processes used to create integrated circuits present in electronic devices such as computers. As device scaling continues to shrink, in accordance with Moore's Law, electrical performance requirements continue to be more important in semiconductor devices. To attain both increased circuit density and required electrical performance, semiconductor device fabrication may include using a number of nanosheets composed of very thin layers of semiconductor or other materials in device formation. Commonly, one or more of the nanosheet stacks are personalized and stacked for semiconductor device formation.

Gate-all-around (GAA) transistors can be formed as vertical gate-all-around (vGAA) or horizontal gate-all-around (hGAA) devices. The vGAA devices nanosheet stack. are commonly formed with sets of vertically oriented, horizontally separated fins. The hGAA devices are commonly formed with a nanosheet stack including horizontally oriented, vertically spaced nanosheets. Conventionally, adjacent p-type field-effect transistor (PFETs) structures and n-type field-effect transistor (NFET) structures are fabricated as a single type of GAA devices, such as two adjacent hGAA devices or vGAA devices where the two adjacent devices are a PFET GAA device and a NFET GAA device. In particular, hGAA devices employing nanosheet stacks are becoming more prevalent as device features continue to scale downward.

SUMMARY

Embodiments of the present invention disclose a semiconductor structure for a first device with a first plurality of channels with a larger horizontal dimension than a vertical dimension of the first plurality of channels. Embodiments of the present invention provide a second device comprising a second plurality of channels with a smaller horizontal dimension than the vertical dimension of the second plurality of channels. The first plurality of channels and the second plurality of channels have the same channel width in embodiments of the present invention. The first device is an n-type horizontal gate-all-around device and the second device is a p-type horizontal gate-all-around device.

Embodiments of the present invention provide a method of forming an n-type horizontal gate-all-around device and a p-type horizontal gate-all-around device. The method includes growing alternating nanosheet layers of a sacrificial material and a channel material that form a nanosheet stack on a substrate and selectively etching portions of the nanosheet stack and the substrate to form a wider column of the remaining portions of the nanosheet stack for n-type device and a narrower column or columns of the remaining portions of the nanosheet stack for a p-type device. The method includes forming more than one shallow isolation trench in the substrate.

In embodiments of the present invention, the method includes forming a dummy gate around and above each of the remaining portions of a plurality of channel nanosheet layers in the remaining portions of the nanosheet stack for both the n-type device and the p-type device and forming a protective spacer around a top portion of the dummy gate. The method includes laterally etching the layers of the sacrificial material and forming an inner spacer abutting a remaining portion of each of the plurality of sacrificial nanosheet layers in the remaining portions of the nanosheet stack. The method includes epitaxially growing source/drains on the substrate abutting outer edges of the remaining portions of the nanosheet stack and the inner spacers for both the n-type device and the p-type device. The method includes removing the dummy gates and each of the remaining portions of the plurality of sacrificial nanosheets in the nanosheet stack. The method includes selectively etching each of the remaining exposed portions of the channel nanosheet layers in the remaining portions of the nanosheet stack in the n-type device. The method includes forming a metal replacement gate around and above each of the remaining portions of the channel nanosheet layers and abutting vertical sides of each inner spacer for both the n-type device and the p-type device where the n-type device forms an n-type field-effect transistor horizontal gate-all-around device and the p-type device forms a p-type field-effect transistor horizontal gate-all-around device.

BRIEF DESCRIPTION OF THE DRAWINGS

The above aspects, other aspects, features, and advantages of various embodiments of the present invention will be more apparent from the following description taken in conjunction with the accompanying drawings.

DETAILED DESCRIPTION

Figure 1:
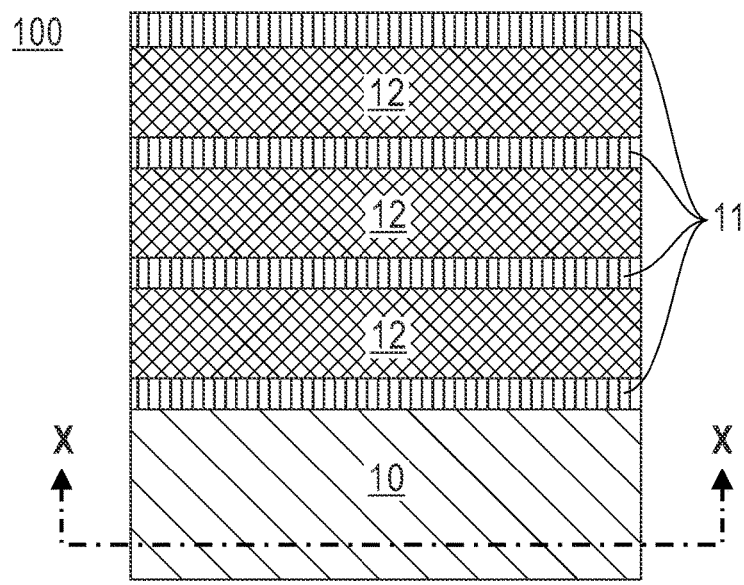
FIG. 1 depicts a cross-sectional view of a semiconductor structure including a substrate with a plurality of alternating material layers composed of a sacrificial layer and channel material, in accordance with an embodiment of the present invention.

Embodiments of the present invention recognize that gate-all-around (GAA) transistors provide a structure similar to a fin field-effect transistor (FinFET) in which the work function metal wraps around a semiconductor channel material within a two-dimensional space. GAA transistors may be preferable where significantly reduced gate lengths are required in a circuit design Embodiments of the present invention recognize that horizontal gate-all-around (hGAA) devices are commonly formed with a nanosheet stack including horizontally oriented, vertically spaced nanosheets. Conventionally, adjacent PFET and NFET structures are fabricated as a single type of GAA device, such as two adjacent hGAA devices or two adjacent vertical gate-all-around (vGAA) devices. Embodiments of the present invention recognize that hGAA devices formed with nanosheet stacks are becoming more prevalent as FETs continue to scale downward in the ten-nanometer (nm) range and below.

Embodiments of the present invention recognize NFETs hGAA devices formed from nanosheet stacks with channels formed in the (100) plane, as identified by the channel material's Miller Indices that indicate the orientation of a plane of the atoms in a crystal, provide better performance than PFETs hGAA devices formed from nanosheet stacks with channels formed in the (100) plane. Embodiments of the present invention recognize that PFETs hGAA devices formed from nanosheet stacks with channels in the (100) plane have been observed to have a degraded electrical performance compared to NFETs hGAA devices formed from the same nanosheet stack. Embodiments of the present invention recognize that an ability to improve the electrical performance of PFETs hGAA devices formed from nanosheets with the channels in the (100) plane would be desirable.

Embodiments of the present invention recognize that forming hGAA devices from nanosheet stacks has created problems when creating device source/drains that are adequately and consistently separated from the work function metal by an inner spacer. The ability to form reliable inner spacers in the nanosheet stack between channels in the nanosheet stack is challenging, especially as feature sizes decrease into the five-nanometer range and below. Embodiments of the present invention recognize a semiconductor structure providing inner spacers with sufficient and repeatable sizes to separate device source/drains from the work function metal in the gate structure and a method of reliably forming inner spacers separating the device source/drains from the work function metal in the gate structure is becoming increasingly important.

Embodiments of the present invention provide semiconductor structures and a method of forming the semiconductor structures with an NFET hGAA structure and a PFET hGAA structure with channel regions that provide a desired electrical performance. Embodiments of the present invention provide channel regions in the active device area for both the NFET and the PFET hGAA devices with a desired channel width or thickness (e.g., approximately four to eight nanometers) that provide the desired electrical performance. Channels in the NFET hGAA device and the PFET hGAA device with the desired channel width will achieve good electrostatic integrity for the device.

Embodiments of the present invention provide the completed NFET hGAA device with a trimmed channel material with a thinner thickness than the as-deposited channel material in the channel material nanosheet layers in the nanosheet stack. The selective trimming of the top and bottom surfaces of the channel material in the channel region of the NFET hGAA device provides the NFET hGAA device with the desired channel thickness. After trimming the NFET channel material, the vertical thickness of the channel material in the NFET hGAA device is thinner than the vertical thickness of the as-deposited and untrimmed channel material in the PFET hGAA device.

Embodiments of the present invention provide the completed PFET hGAA device with two columns of thin, vertical portions or FIN-like portions of the channel material in the PFET hGAA device after patterning and etching the nanosheet stack. The thin, vertical portions of the channel material are significantly thinner than the portions of the channel material in the NFET hGAA device. The PFET hGAA device provides a new vertical nano-ellipse shape for the remaining portions of the channel material in the nanosheet stack. Embodiments of the present invention provide two thin vertical columns of vertical nano-ellipse shaped portions of the channel material forming the channel in the active device region of the PFET hGAA device. The horizontal thickness or the horizontal width of each of the nano-ellipse shaped portions of the channel material in the PFET hGAA device has the desired channel thickness which is the horizontal width of each of the nano-ellipse shaped portions of the channel material (e.g., approximately 4 to 8 nm wide). In this way, the channel of the active region of the PFET hGAA device where the device electrical current flows horizontally through the vertical sidewalls of each of the nano-ellipse-shaped portions of the channel material has a similar channel thickness or channel width as the vertical thickness of channel width in the NFET hGAA device after trimming of the channel material (i.e., the electrical current flows vertically through the remaining portions of the channel material in the NFET hGAA device). Embodiments of the present invention provide both an NFET hGAA device and a PFET hGAA device formed from a nanosheet stack of two alternating semiconductor materials that both have the desired channel width. The vertical thickness (i.e., a channel width) of the trimmed channel material in the NFET hGAA device is approximately the same as the horizontal channel material width in the PFET hGAA device.

Embodiments of the present invention provide a vertical thickness of the replacement gate in the channel region between the trimmed channel material in the NFET hGAA device that is thinner than the vertical thickness of the replacement gate between the nano-ellipse shaped portions of the channel material in the PFET hGAA device.

Embodiments of the present invention provide a method to form a horizontal channel in an NFET hGAA device from a nanosheet stack with the desired thickness for the channel width using a nanosheet trimming of the as-deposited nanosheet channel layers to meet the desired channel width (e.g., approximately, 4 to 8 nm for the trimmed channel material vertical thickness). Embodiments of the present invention also a method to form unique vertical nano-ellipse shaped or FIN-like portions of the channel material in the PFET hGAA device using lithography and an etch process to selectively remove portions of the nanosheet stack to form two thin, columns of nanosheet stack. After various etching processes, the thin, vertical nano-ellipse-shaped portions of the remaining channel material to form the PFET hGAA device have a channel. The vertical nano-ellipse shaped portions of the channel material provide the PFET hGAA with the desired channel thickness. The channel width for the PFET hGAA device formed using the vertical nano-ellipse shaped portions of the channel material have a channel width that extends horizontally across each of the vertical nano-ellipse shaped portions of the channel material.

The method disclosed in embodiments of the present invention includes forming a nanosheet stack of alternating layers of a sacrificial semiconductor material and a semiconductor material, such as silicon on a semiconductor substrate. The method includes using lithography for patterning and one or more etching processes (e.g., reactive ion etch) to form a wider column of the remaining portion of the nanosheet stack for the NFET device, two narrower columns of the remaining portions of the nanosheet stack for the PFET device, and trenches are formed in the semiconductor substrate for shallow trench isolation (STI). The deposition of the dielectric material completes the STI formation. After the nanosheet stack etching, the two narrow columns of the remaining portions of the nanosheet stack for the PFET device have the desired channel thickness in the horizontal cross-sectional area for the desired electrical performance.

The method includes forming a dummy gate structure and forming a spacer around the dummy gate and depositing a hardmask. The method includes removing portions of the nanosheet stack not protected by the spacer or the hardmask. The method includes recessing the sacrificial material to deposit an inner spacer and growing a device suitable source/drain, for example, using a doped epitaxy material around the remaining portions of the nanosheet stack. The method includes removing the dummy gate and the sacrificial material between the channel material. A softmask material can be deposited over the structure and patterned to expose portions of the NFET hGAA precursor device and cover the PFET hGAA precursor device.

Embodiments of the present invention include trimming the exposed portions of the channel material in the NFET hGAA precursor device only. The trimming of the channel material leaves the vertical thickness of the NFET device with the desired channel thickness. The softmask is removed and a replacement gate structure is formed.

The method of forming NFET hGAA devices with trimmed channel regions and PFET hGAA devices with vertical nano-ellipse shaped channel regions that are formed from a nanosheet stack of alternating sacrificial semiconductor materials, such as SiGe and a semiconductor material, such as silicon provides the desired channel width for the desired electrical performance and good electrostatic integrity of the semiconductor devices. Embodiments of the present invention provide a method of patterning and selective etching of the nanosheet stack that forms narrow vertical nano-ellipse shaped portions of the channel material for the PFET hGAA device that have a horizontal channel width that meets the desired channel width while the trimming of the top and bottom surfaces of the horizontal nanosheets of the channel material in the NFET hGAA device will create a vertical thickness of the remaining channel material with the device channel width that also attains the desired channel width.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. For the purposed of the present invention, the terms "nanosheet stack" and "nanosheet stack" are interchangeable. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes as used herein include but are not limited to ionized plasma vapor deposition (iPVD), plasma vapor deposition (PVD), electroplating atomic layer deposition (ALD), plasma-enhanced chemical vapor deposition (PECVD), CVD, gas cluster ion beam (GCIB) deposition, ionized plasma vapor deposition (iPVD), PVD, or electroplating.

Selectively etching as used herein includes but is not limited to patterning using one of lithography, photolithography, an extreme ultraviolet (EUV) lithography process, or any other known semiconductor patterning process followed by one or more the etching processes. Various materials are referred to herein as being removed or "etched" where etching generally refers to one or more processes implementing the removal of one or more materials while leaving other protected areas of the materials that are masked during the lithography processes unaffected. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Plasma systems can operate in several modes by adjusting the parameters of the plasma. Ordinary plasma etching produces energetic free radicals, neutrally charged, that react at the surface of the wafer and is an isotopic etch process (e.g., removes material in all directions. Ion milling, sputter etching, or reactive ion etching (RIE) bombards the wafer with energetic ions of noble gases that approach the wafer approximately from one direction, and therefore, these processes are anisotopic or a directional etching process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Reference is now made to the figures. The figures provide a schematic cross-sectional illustration of semiconductor devices at intermediate stages of fabrication, according to one or more embodiments of the invention. The figures provide schematic representations of the devices of the invention and are not to be considered accurate or limiting with regards to device element scale.

FIG. 1 depicts cross-sectional view 100 of a semiconductor structure including substrate 10 with a plurality of alternating material layers composed of sacrificial layer 11 and channel material 12, in accordance with an embodiment of the present invention. As depicted, FIG. 1 includes substrate 10 under sacrificial layer 11 which in turn is under a layer of channel material 12 where the layers of sacrificial layer 11 and channel material 12 alternate to form the nanosheet stack. In other examples, the number of nanosheets of sacrificial layer 11 and channel material 12 forming the nanosheet stack is different (e.g., can vary by design and semiconductor chip application). In other examples, there may be more or fewer layers of sacrificial layer 11 and channel material 12 in the nanosheet stack.

Substrate 10 is composed of any semiconductor substrate material suitable for a substrate in a Complementary Metal-Oxide-Semiconductor (CMOS) device, such as a but not limited to hGAA device using one of an NFET or PFET device structure. In various embodiments, semiconductor substrate 10 is a silicon semiconductor material. In other embodiments, substrate 10 is composed of a group IV semiconductor material (e.g., germanium ( ), a group III-V semiconductor material, a group II-VI semiconductor material, or other known semiconductor material or compounds of any known semiconductor material used in semiconductor circuits where the groups are columns or groups of elements in the Periodic Table of Elements. In various embodiments, substrate 10 is a wafer or a portion of a wafer. In some embodiments, semiconductor substrate 10 includes one or more doped, undoped, or contains doped regions, undoped regions, stressed regions, or defect-rich regions. In some examples, substrate 10 may include one or more other devices or transistors (not depicted). In an embodiment, substrate 10 is one of a layered semiconductor substrate, such as a semiconductor-on-insulator substrate (SOI), germanium on insulator (GeOI), or silicon-on-replacement insulator (SRI).

In various embodiments, the nanosheet stack depicted in FIG. 1 is comprised of alternating nanosheet layers of sacrificial layer 11 and channel material 12 where channel material 12 resides between two nanosheet layers of sacrificial layer 11. Each nanosheet layer of the nanosheet stack can be composed of the alternating layers of sacrificial layer 11 and channel material 12. The nanosheet stack can be formed by epitaxially growing each layer of the nanosheet stack. The first layer of sacrificial layer 11 can be epitaxially grown on substrate 10 and a first nanosheet layer of channel material 12 can be grown on the first layer of sacrificial layer 11. Subsequent layers of sacrificial layer 11 are deposited on layers of channel material 12, which in turn, are grown on each layer of sacrificial layer 11. In various embodiments, a layer of sacrificial layer 11 is the top sheet of the nanosheet stack on substrate 10.

Sacrificial layer 11 is a layer of a sacrificial material. Sacrificial layer 11 may be composed of a semiconductor material. In various embodiments, sacrificial layer 11 is composed of SiGe. The composition of SiGe may vary depending on the semiconductor chip application. For example, sacrificial layer 11 can be comprised of $Si_xGe_y$, where x and y represent a relative atomic concentration of silicon (Si) and germanium (Ge), respectively. In some embodiments, x and y are less than 1 and their sum is equal to 1. In an embodiment, sacrificial layer 11 is composed of another material capable of uniform deposition in a nanosheet layer that is compatible with semiconductor manufacturing processes and that is suitable for a selective etch of one or more sacrificial layers 11 that are between channel material 12.

A thickness of sacrificial layer 11 can be dictated by subsequent process steps and electrical requirements of the completed hGAA NFET and/or PFET device. For example, the thickness of sacrificial layer 11 is thin enough to allow selective removal of each of sacrificial layers 11 in subsequent process steps and is thick enough to provide enough space between each of adjacent layers of channel material 12 for deposition of an inner spacer and a work function metal between portions of channel material 12 after recessing portions of sacrificial layer 11 and removing sacrificial layers 11, respectively in subsequent steps. In various embodiments, a thickness of sacrificial layer 11 is between 2 and 20 nanometers but is not limited to these thicknesses.

Channel material 12 can be composed of any semiconductor material suitable for forming a channel in an NFET hGAA or a PFET hGAA device. In various embodiments, channel material 12 is composed of silicon. Each nanosheet layer of channel material 12 is surrounded above and below by a nanosheet layer of sacrificial layer 11. As depicted in FIG. 1, each layer of channel material 12 alternates with layers of sacrificial layer 11. In various embodiments, channel material 12 is a layer of silicon for the channel in a hGAA device (e.g., a PFET device or an NFET hGAA device). In an embodiment, channel material 12 is a III-V semiconductor material but is not limited to these semiconductor materials. In one embodiment, two different and alternating semiconductor materials can be used for channel material 12 (i.e., channel material 12A and channel material 12B not depicted in FIG. 1).

Each layer of channel material 12 can have a thickness that is thicker as-deposited than the desired thickness for providing required electrical performance. In subsequent processes using processes described in later process steps, the final channel widths for both the NFET hGAA device and the PFET hGAA device in FIGS. 20 and 21, respectively have the suitable size or desired channel width (e.g., approximately 4 to 8 nm) for providing optimal electrical performance. In various embodiments, the thickness of channel material 12 is between 8 and 20 nanometers as-deposited but, is not limited to this range of thickness. Each layer of channel material 12 is between a layer of sacrificial layer 11 above and below the layer of channel material 12.

FIGS. 2, 3, 4, and 5 depict the cross-sectional views in a first direction or an X-direction and a second direction or a Y-direction of the NFET active regions (FIGS. 2 and 3) and the PFET active regions (FIGS. 4 and 5) after the active regions are defined by lithography and etching process, then followed by shallow trench recessing, STI dielectric fill, and a chemical mechanical polish (CMP).

Figure 2:
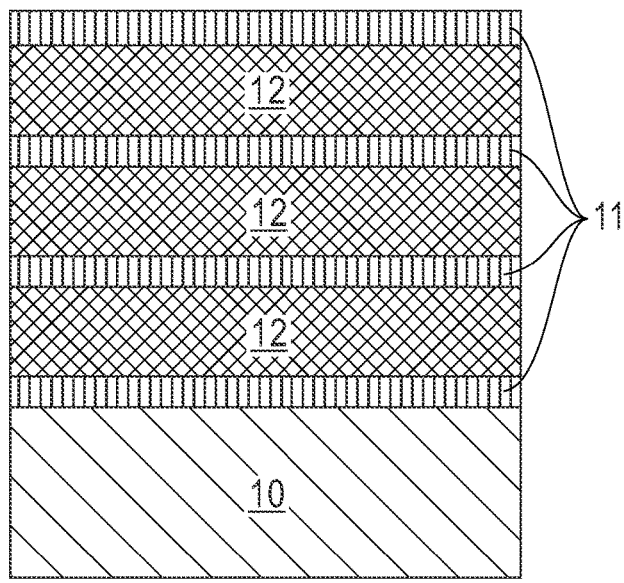
FIG. 2 depicts a cross-sectional view through a first direction in a precursor structure of an NFET hGAA device of the semiconductor structure after patterning and selectively removing portions of the sacrificial material, the channel material, and the substrate to form one or more shallow isolation trenches, in accordance with an embodiment of the present invention.

FIG. 2 depicts cross-sectional view 200 through a first direction in a precursor structure of an NFET hGAA device in semiconductor structure after patterning and selectively removing portions of sacrificial layer 11, channel material 12, and substrate 10 to form one or more shallow isolation trenches (not depicted in FIG. 2), in accordance with an embodiment of the present invention. The first direction is a direction that cuts across the gate area or cuts across where the dummy gate and the replacement gate will be formed in subsequent processes. The first direction may be considered the X direction in FIG. 1 that goes from left to right as depicted in FIG. 1. The cross-sectional views across the first direction are in the even-numbered FIGs. in the present invention. As depicted, FIG. 2 includes the elements of FIG. 1 after removing portions of the nanosheet stack.

Figure 3:
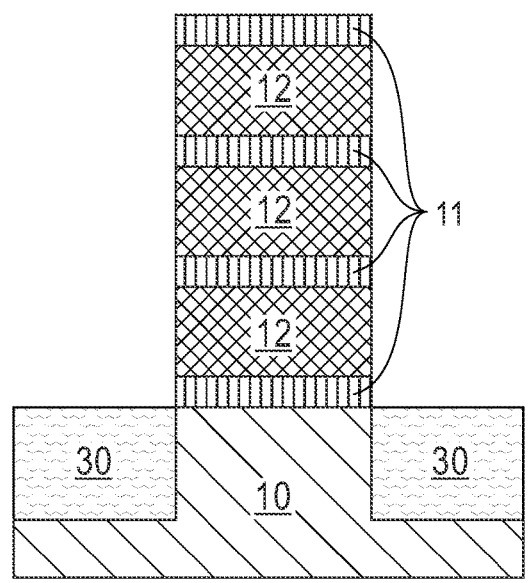
FIG. 3 depicts a cross-sectional view through a second direction in the precursor structure of the NFET hGAA device depicted after patterning and selectively etching portions of the sacrificial layer 11, the channel material, and the substrate to form one or more shallow isolation trenches (STI), in accordance with an embodiment of the present invention.

Not depicted in cross-sectional view 200, portions of the nanosheet stack for the NFET can be selectively etched (e.g., using lithography and RIE) to remove portions of each of the nanosheet layers of sacrificial layer 11, channel material 12, and substrate 10 as depicted in FIG. 3.

After completing the selective etching of each layer of sacrificial layer 11 and channel material 12, a pillar or column of the nanosheet stack of sacrificial layer 11 and channel material 12 remains. For example, the width of the remaining portions of sacrificial layer 11 and channel material 12 in the precursor structure of the n-type or NFET device as depicted in FIG. 3 can range from 10 to 100 nm but is not limited to this range. The portions of channel material 12 in the remaining portion of the nanosheet stack in the NFET device region provide channel surface orientation in the (100) plane as the dominant channel surface orientation (e.g., channel material 12 provides between a preferred surface orientation for NFET hGAA device performance).

FIG. 3 depicts cross-sectional view 300 through a second direction in the precursor structure of the NFET hGAA device depicted after patterning and selectively etching portions of sacrificial layer 11, channel material 12, and substrate 10 to form one or more shallow isolation trenches (STI) 30, in accordance with an embodiment of the present invention. The second direction is a direction that cuts across the nanosheet stack area of the precursor NFET device structure and the second direction is perpendicular (i.e., 90 degrees to) the first direction. The second direction may be considered the Y direction (not depicted in FIG. 1) of structure 100 in FIG. 1 that goes into and out of the paper and is perpendicular to the X-X cross-section location depicted in FIG. 1. The cross-sectional views across the second direction are depicted in the odd-numbered FIGs. in the present invention. As depicted, FIG. 3 includes the elements of FIG. 1 and two STIs 30.

Using a lithography process, the top layer sacrificial layer 11 is patterned, and portions of sacrificial layer 11, channel material 12, and substrate 10 are selectively removed, for example using RIE, to form trenches in substrate 10. The trenches in substrate 10 can be filled using known deposition processes with any dielectric material, such as $SiO_2$ suitable for STIs. As depicted in cross-sectional view 300, two shallow trench isolation (STI) 30 in substrate 10 are formed on either side of a column of the remaining portions of the nanosheet stack.

Figure 4:
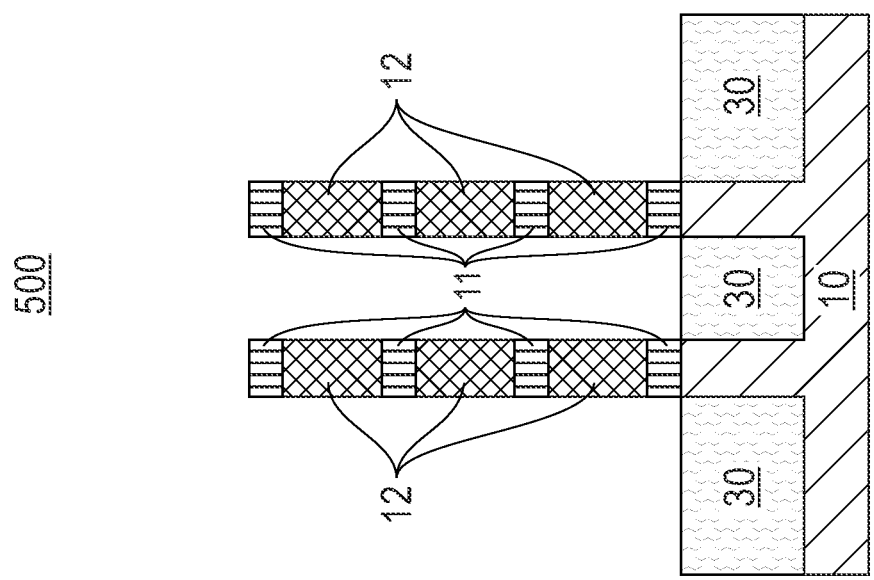
FIG. 4 depicts a cross-sectional view through the first direction in a precursor of a PFET hGAA device after patterning and selectively etching portions of the sacrificial layer 11, the channel material, and the substrate to form one or more STIs (not depicted in FIG. 4), in accordance with an embodiment of the present invention.

FIG. 4 depicts the cross-sectional view 400 through the first direction in a precursor of a PFET hGAA device after patterning and selectively etching portions of sacrificial layer 11, channel material 12, and substrate 10 to form one or more STI 30 (not depicted in FIG. 4), in accordance with an embodiment of the present invention. As depicted, FIG. 4 includes substrate 10 with the nanosheet stack of sacrificial layer 11, and channel material 12. The cross-sectional view 400 through the first direction of the semiconductor structure of the precursor of the PFET device is the same as the cross-sectional view 200 through the first direction of the semiconductor structure of the precursor of the NFET device. Cross-sectional view 400 does not depict the selective etch of the portions of sacrificial layer 11, channel material 12, and substrate 10 and therefore, does not depict any of STI 30 and is essentially the same as FIG. 2.

Figure 5:
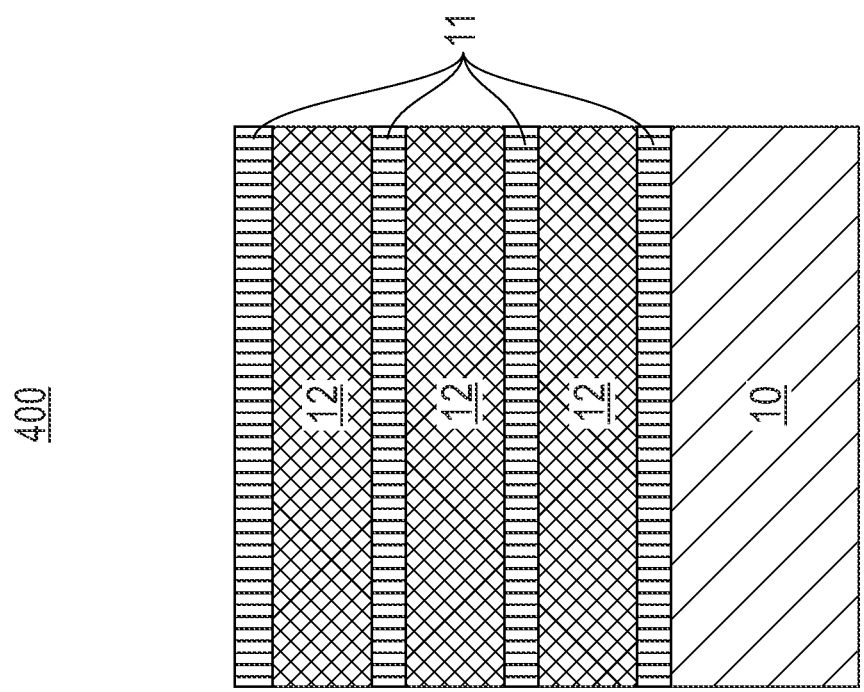
FIG. 5 depicts a cross-sectional view through the second direction in the precursor structure of the PFET hGAA device after patterning and selectively etching portions of the sacrificial material, the channel material, and the substrate to form one or more STI, in accordance with an embodiment of the present invention.

FIG. 5 depicts the cross-sectional view 500 through the second direction in the precursor structure of the PFET hGAA device after patterning and selectively etching portions of sacrificial layer 11, channel material 12, and substrate 10 to form one or more STI 30, in accordance with an embodiment of the present invention. As depicted, FIG. 5 includes substrate 10 with three STI 30, sacrificial layer 11, and channel material 12 where the remaining portions of sacrificial layer 11 and channel material 12 form two narrow columns or pillars on substrate 10 between the three STI 30. While FIG. 5 depicts two columns or pillars of the remaining portion of the nanosheet stack in the PFET device region, in other embodiments, either one column of the remaining nanosheet stack is formed in the PFET device region or more than two columns of the remaining nanosheet stack are formed in the PFET device region. The widths of the two narrow columns of sacrificial layer 11 and channel material 12 can range from 5 to 8 nm but are not limited to this range.

As depicted in FIG. 5, each of the remaining portions of channel material 12 in the two pillars have a horizontal width that is much smaller than the vertical height of each of the portions of channel material 12. The remaining portions of channel material 12 with a narrow horizontal dimension and a larger vertical dimension can form vertical nano-ellipse shaped channels in the completed PFET hGAA device depicted in FIG. 21. Forming the vertical nano-ellipse shaped channels for the PFET hGAA device provides channel surface orientation (110) as dominant channel surface orientation which provides higher hole mobility for better electrical performance of the PFET device.

FIGS. 6, 7, 8, and 9 depict the cross-sectional views in the first direction or then X-direction and the second direction or the Y-direction of the NFET active regions (FIGS. 6 and 7) and the PFET active regions (FIGS. 8 and 9) after forming dummy gate 66, protective spacer 61, inner spacer 60, hardmask 62, and the source/drain epi (i.e., source/drain 68)

Figure 6:
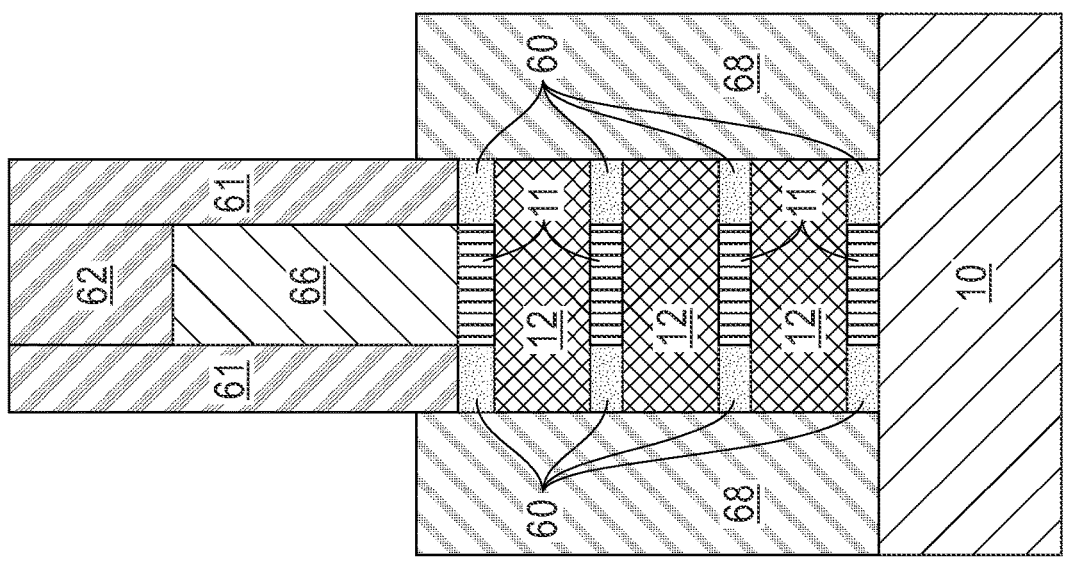
FIG. 6 depicts a cross-sectional view of through the first direction in the precursor structure of the NFET hGAA device after performing one or more etching processes and depositing a dummy gate, an inner spacer, the protective spacer, the gate hardmask, and forming source/drain (S/D), in accordance with an embodiment of the present invention.

FIG. 6 depicts cross-sectional view 600 through the first direction in the precursor structure of the NFET hGAA device after forming dummy gate 66 with gate hardmask 62, protective spacer 61, inner spacer 60, and source/drain (S/D) 68, in accordance with an embodiment of the present invention. As depicted, FIG. 6 includes substrate 10, S/D 68, inner spacer 60, sacrificial layer 11, channel material 12, protective spacer 61 around dummy gate 66, and gate hardmask 62 over dummy gate 66.

As depicted in FIG. 6, dummy gate 66 may be deposited on a top layer of sacrificial layer 11 in the nanosheet stack. In some embodiments, dummy gate 66 is composed of amorphous silicon, polysilicon, amorphous silicon, or multilayered combinations thereof. A dummy gate dielectric (not depicted) may be deposited under dummy gate 66. Hardmask 62 composed of a hardmask material, such as SiN may be deposited over dummy gate 66. Dummy gate 66 may be patterned and etched (e.g., by RIE). Protective spacer 61 can be deposited around dummy gate 66 and gate hardmask 62 using known sidewall spacer formation processes, such as ALD, CVD, PECVD and may be composed of any suitable spacer material, such as SiOCN, SiBCN, SiN, SiOC, etc, followed by an anisotropic spacer RIE process to remove spacer liner from horizontal surfaces.

After forming protective spacer 61 around dummy gate 66, the nanosheet stack may be etched to the same width as protective spacer 61 around dummy gate 66. For example, using an RIE process, outside portions of the nanosheet stack can be removed such that protective spacer and the outside edges of sacrificial layer 11 and channel material 12 in the nanosheet stack are vertically aligned as depicted in FIG. 6.

A lateral etch process can be performed on the outside edges of sacrificial layer 11 after forming dummy gate 66 with protective spacer 61 (after etching outside portions of the nanosheet stack not under protective spacer 61). The lateral etch process, which can be, for example, a vapor phase hydrochloric acid (HCl) dry etch or a wet etch process containing a mix of ammonia and hydrogen peroxide, or any other suitable etching process for sacrificial layer 11 material but is not limited to these etching processes removes the exposed outer edges of sacrificial layer 11. The lateral etching of sacrificial layer 11 creates a recess or divot between adjacent layers of channel material 12. A depth of the recess from the remaining sacrificial layer 11 to an outside edge of channel material 12 can range from 4 to 10 nm but is not limited to this range. In other words, 4 to 10 nm of sacrificial layer 11 is removed from the outer edges of sacrificial layer 11.

A plurality of inner spacers 60 can be deposited in the recessed area formed by the lateral etching process of each layer of sacrificial layer 11. Inner spacers 60 can be composed of a spacer material, such as SiN, SiBCN, SiOCN, SiOC, or other suitable spacer material for the NFET hGAA device.

As depicted in FIG. 6, source/drains (S/D) 68 can be epitaxially grown on portions of substrate 10 abutting the vertical outside edges of inner spacers 60, channel material 12, and along a bottom portion of protective spacer 61. In some embodiments, one or more portions of S/D 68 may be doped in-situ with a device-appropriate dopant in the epitaxial material. For example, S/D 68 for a PFET hGAA device, a p-type dopant may be one of but not limited to boron, aluminum, gallium, or indium, and one or more of S/D 68 for an NFET hGAA device, an n-type dopant, such as but not limited to antimony, arsenic, and phosphorous may be used as an impurity. S/D 68 depicted in FIG. 6 can be doped with an n-type dopant for forming an NFET hGAA device.

Figure 7:
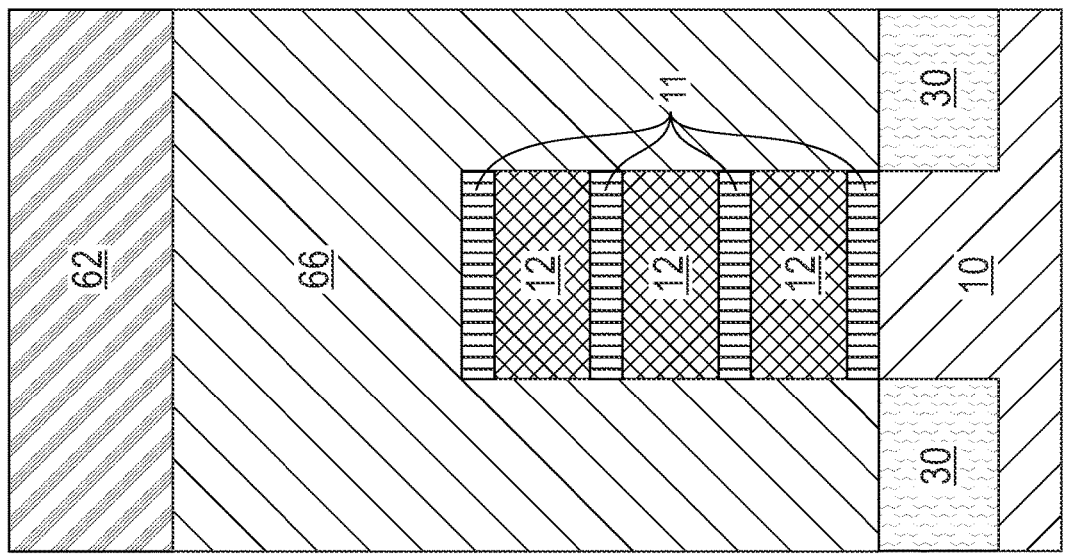
FIG. 7 depicts a cross-sectional view through the second direction in the precursor structure of the NFET hGAA device after performing one or more etching processes and depositing the dummy gate, the inner spacer, the hardmask, the protective spacer, and growing a source/drain, in accordance with an embodiment of the present invention.

FIG. 7 depicts cross-sectional view 700 through the second direction in the precursor structure of the NFET hGAA device after forming dummy gate 66 with gate hardmask 62, protective spacer 61 (not depicted), inner spacer 60 (not depicted), and growing S/D 68 using epitaxy (not depicted), in accordance with an embodiment of the present invention. As depicted, FIG. 7 includes the elements of FIG. 3 with dummy gate 66 and gate hardmask 62.

As previously discussed with respect to FIG. 6, dummy gate 66 can be deposited over the top layer of sacrificial layer 11 in the stack of alternating nanosheet layers of sacrificial layer 11 and channel material 12 and over STIs 30. Dummy gate 66 surrounds the vertical sides of the stack of nanosheet layers of sacrificial layer 11 and channel material 12. As depicted, a layer of gate hardmask 62 is deposited over dummy gate 66.

Figure 8:
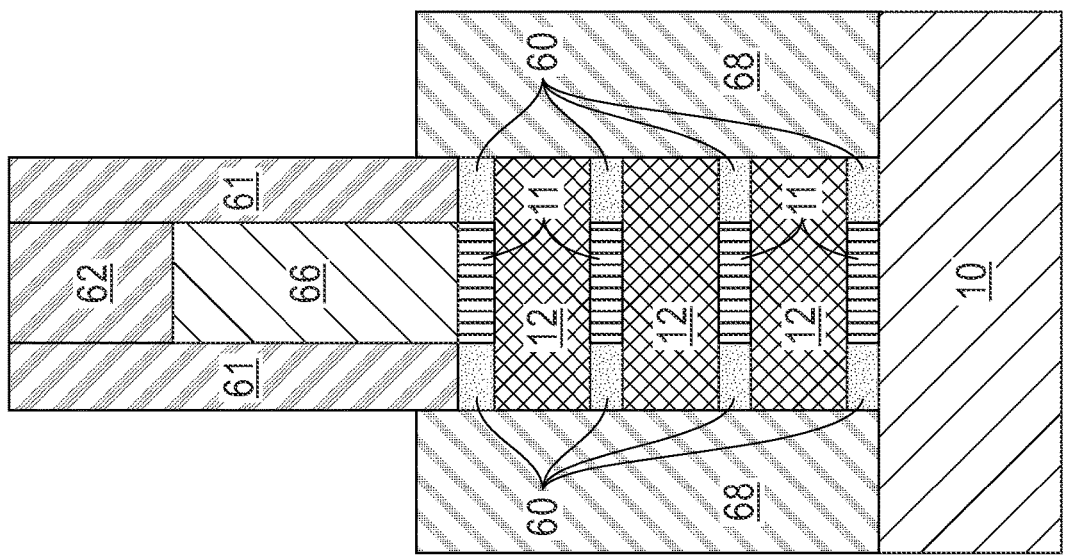
FIG. 8 depicts a cross-sectional view through the first direction in the precursor structure of the PFET hGAA device after performing one or more etching processes and depositing the dummy gate, the inner spacer, the hardmask, the protective spacer, and growing a source/drain, in accordance with an embodiment of the present invention.

FIG. 8 depicts cross-sectional view 800 through the first direction in the precursor structure of the PFET hGAA device after forming dummy gate 66 with gate hardmask 62, protective spacer 61, inner spacer 60, and S/D 68, in accordance with an embodiment of the present invention. As depicted, FIG. 8 includes substrate 10, S/D 68, inner spacer 60, sacrificial layer 11, channel material 12, protective spacer 61 around dummy gate 66, and gate hardmask 62 over dummy gate 66. The precursor structure depicted in FIG. 8 can be formed with the processes previously discussed with respect to FIG. 6. As depicted cross-sectional view 800 is essentially the same as cross-sectional view 600 except that S/D 68 in FIG. 8 is formed with p-type doped source/drain epi for forming a PFET hGAA device.

Figure 9:
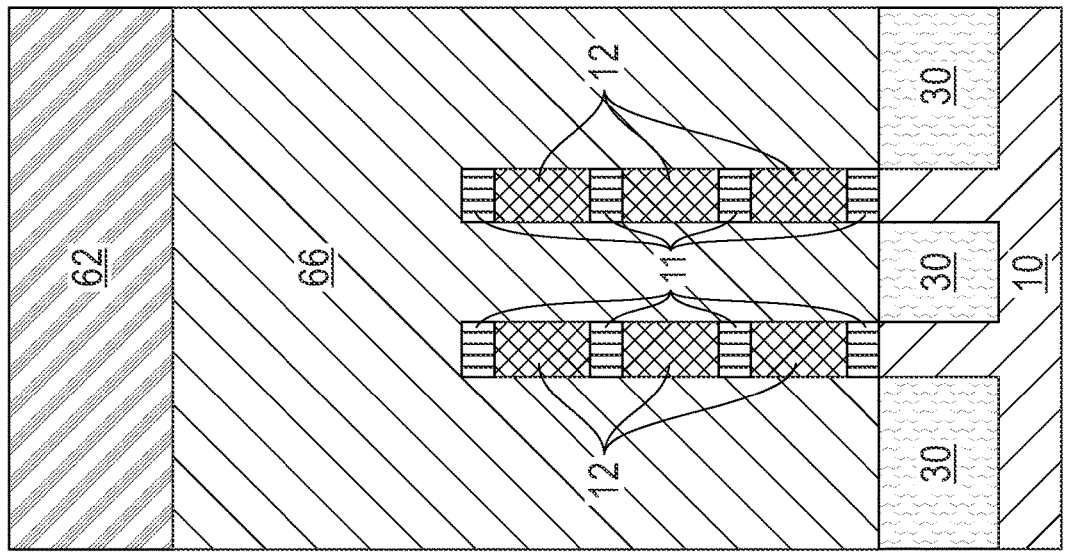
FIG. 9 depicts a cross-sectional view through the second direction in the precursor structure of the PFET hGAA device after performing one or more etching processes and depositing the dummy gate, the inner spacer, the hardmask, the protective spacer, and growing a source/drain, in accordance with an embodiment of the present invention.

FIG. 9 depicts cross-sectional view 900 through the second direction in the precursor structure of the PFET hGAA device after forming dummy gate 66 with gate hardmask 62, protective spacer 61 (not depicted), inner spacer 60 (not depicted), and growing S/D 68 (not depicted), in accordance with an embodiment of the present invention. As depicted, FIG. 9 includes the elements of FIG. 5 and dummy gate 66 covered by gate hardmask 62. As previously discussed, dummy gate 66 can be deposited using CVD, PECVD, or PVD, for example, on exposed surfaces of STI 30 and around the remaining portions of the nanosheet stack. Dummy gate 66 surrounds and extends above the two narrow columns of the remaining portions of the alternating nanosheet layers of sacrificial layer 11 and channel material 12. As previously discussed, gate hardmask 62 can be deposited over dummy gate 66.

FIGS. 10, 11, 12, and 13 depict the cross-sectional views in the first direction or the X-direction and the second direction or the Y-direction of the NFET active regions (FIGS. 10 and 11) and the PFET active regions (FIGS. 12 and 13) after depositing ILD 75, which is followed by a CMP process to expose dummy gate 66, followed by the removal of dummy gate 66 and sacrificial layer 11 to expose channel material 12.

Figure 10:
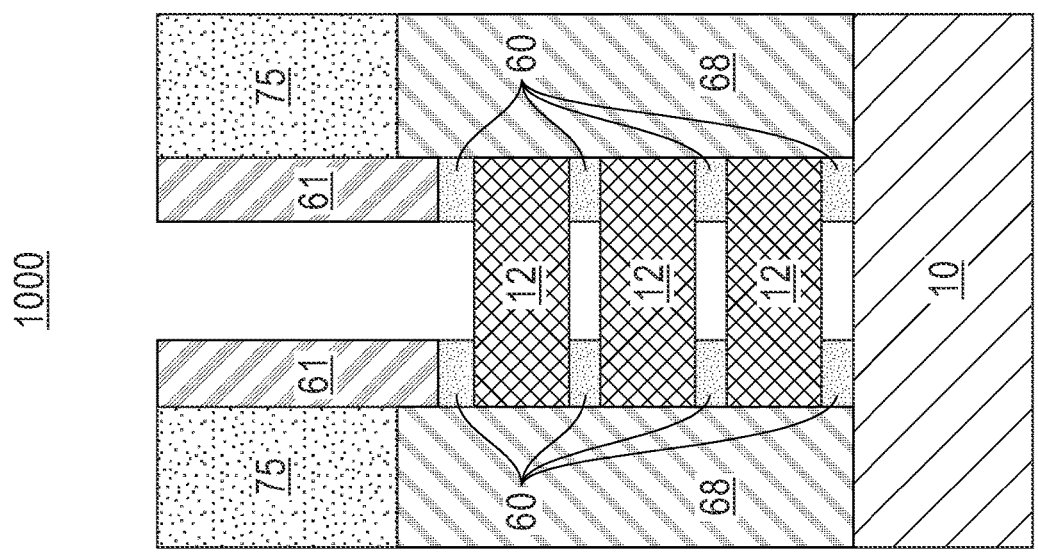
FIG. 10 depicts a cross-sectional view through the first direction in the precursor structure of the NFET hGAA device in the semiconductor structure after depositing an interlayer dielectric (ILD) and removing the dummy gate, hardmask, and the sacrificial material, in accordance with an embodiment of the present invention.

FIG. 10 depicts a cross-sectional view 1000 through the first direction in the precursor structure of the NFET hGAA device in the semiconductor structure after depositing ILD 75 and removing gate hardmask 62, dummy gate 66, and sacrificial layer 11, in accordance with an embodiment of the present invention. As depicted, FIG. 10 includes the elements of FIG. 6 with ILD 75 over S/D 68, and with dummy gate 66 and sacrificial layer 11 removed. A layer of ILD 75 may be deposited over S/D 68 and gate hardmask 62 and a CMP can be performed to remove gate hardmask 62 exposing dummy gate 66.

Dummy gate 66 may be removed, for example, using an isotropic wet etch or dry etch process or a combination of one or more of these etching processes. The nanosheet layers of sacrificial layer 11 in the nanosheet stack can be removed using any suitable selective etching process. For example, sacrificial layer 11 may be removed using a vapor phase dry hydrochloric acid (HCL) etch process, or a wet etch process containing a mix of ammonia and hydrogen peroxide, or another etching process suitable for removing sacrificial layer 11 from the nanosheet stack without removing channel material 12. Inner spacer 60 and channel material 12 protect S/D 68 during the selective etching of sacrificial layer 11.

Figure 11:
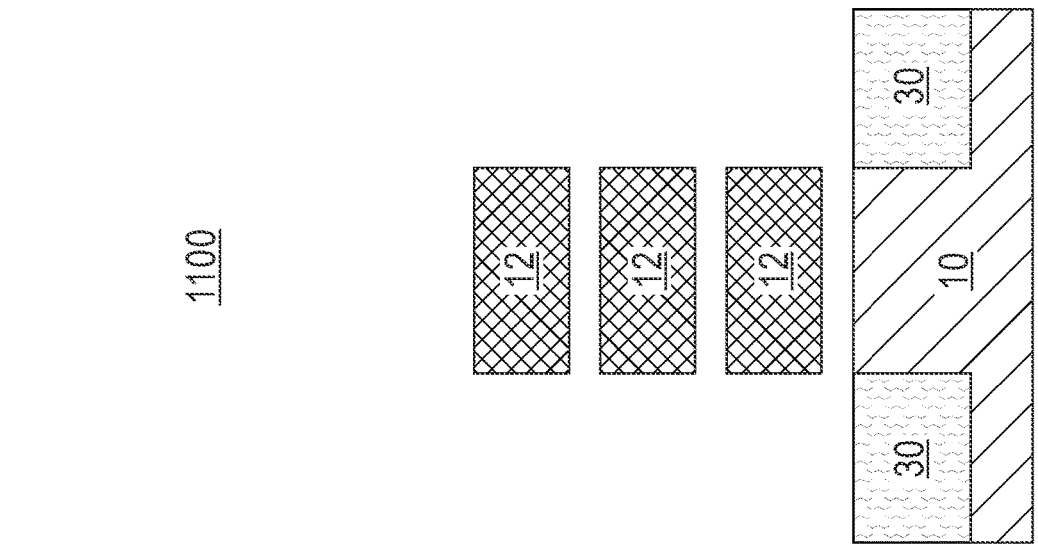
FIG. 11 depicts a cross-sectional view through the second direction in the precursor structure of the NFET hGAA device in the semiconductor structure after depositing an ILD and removing the dummy gate, hardmask, and the sacrificial material, in accordance with an embodiment of the present invention.

FIG. 11 depicts cross-sectional view 1100 through the second direction in the precursor structure of the NFET hGAA device in the semiconductor structure after depositing ILD 75 and removing gate hardmask 62, dummy gate 66, and sacrificial layer 11, in accordance with an embodiment of the present invention. As depicted, FIG. 11 includes substrate 10, STIs 30, and channel material 12 (ILD 75 is not depicted in FIG. 11). Using the processes discussed above, ILD 75 is deposited (not depicted), and gate hardmask 62, dummy gate 66, and sacrificial layer 11 are removed.

Figures 12, 13:
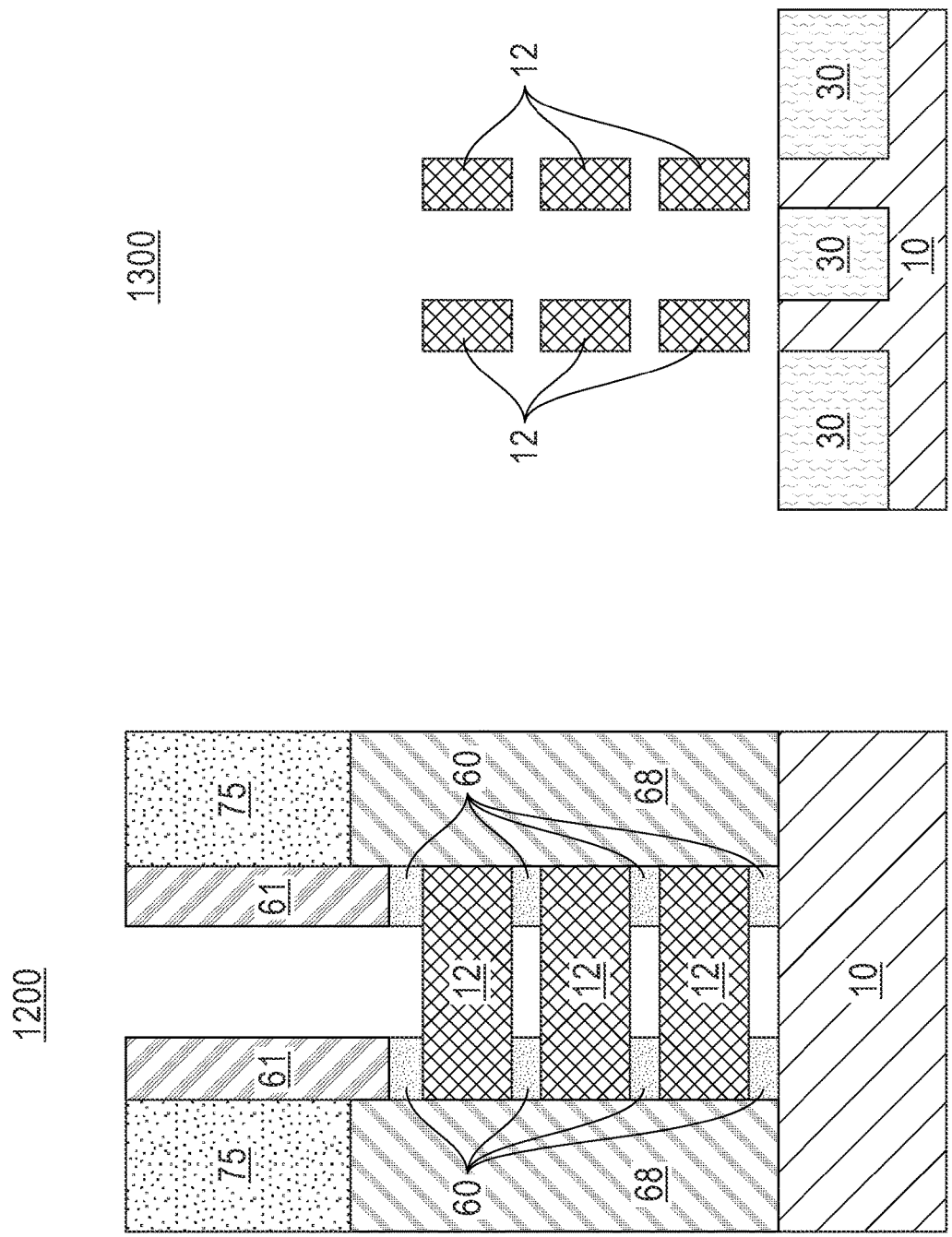
FIG. 12 depicts a cross-sectional view through the first direction in the precursor structure of the PFET hGAA device in the semiconductor structure after depositing an ILD and removing the dummy gate, hardmask, and the sacrificial material, in accordance with an embodiment of the present invention.
FIG. 13 depicts a cross-sectional view through the second direction in the precursor structure of the PFET hGAA device in the semiconductor structure after depositing an ILD and removing the dummy gate, hardmask, and the sacrificial material, in accordance with an embodiment of the present invention.

FIG. 12 depicts cross-sectional view 1200 through the first direction in the precursor structure of the PFET hGAA device in the semiconductor structure after depositing ILD 75 and removing gate hardmask 62, dummy gate 66, and sacrificial layer 11, in accordance with an embodiment of the present invention. As depicted, FIG. 12, includes the elements of FIG. 10 except that in FIG. 12, S/D 68 is doped with a p-type dopant instead of an n-type dopant used in FIG. 10. Cross-sectional view 1200 is formed using the processes discussed above with reference to FIG. 10.

FIG. 13 depicts cross-sectional view 1300 through the second direction in the precursor structure of the PFET hGAA device in the semiconductor structure after depositing ILD 75 (not depicted) and removing hardmask 62, dummy gate 66, and sacrificial layer 11, in accordance with an embodiment of the present invention. As depicted, FIG. 13 includes STIs 30 in substrate 10 and two narrow columns of the remaining portions of channel material 12. As previously discussed with respect to FIG. 5, the remaining portions of channel material 12 can have a vertical nano-ellipse shape where the horizontal width of each portion of channel material 12 is narrow and the vertical length of the portions of channel material 12 is more than the width of channel material 12 (e.g., the vertical length of the portions of channel material 12 can be twice the width of the remaining portions of channel material 12). Cross-sectional view 1300 is formed using the processes discussed above with respect to FIG. 10.

FIGS. 14, 15, 16, and 17 depict the cross-sectional views in the first direction or the X direction and the second direction or the Y-direction of the NFET active regions (FIGS. 14 and 15) and the PFET active regions (FIGS. 16 and 17) after the NFET channels (e.g., channel material 12) are trimmed to a smaller size while PFET channels are protected by a masking layer (i.e., softmask 80).

Figure 14:
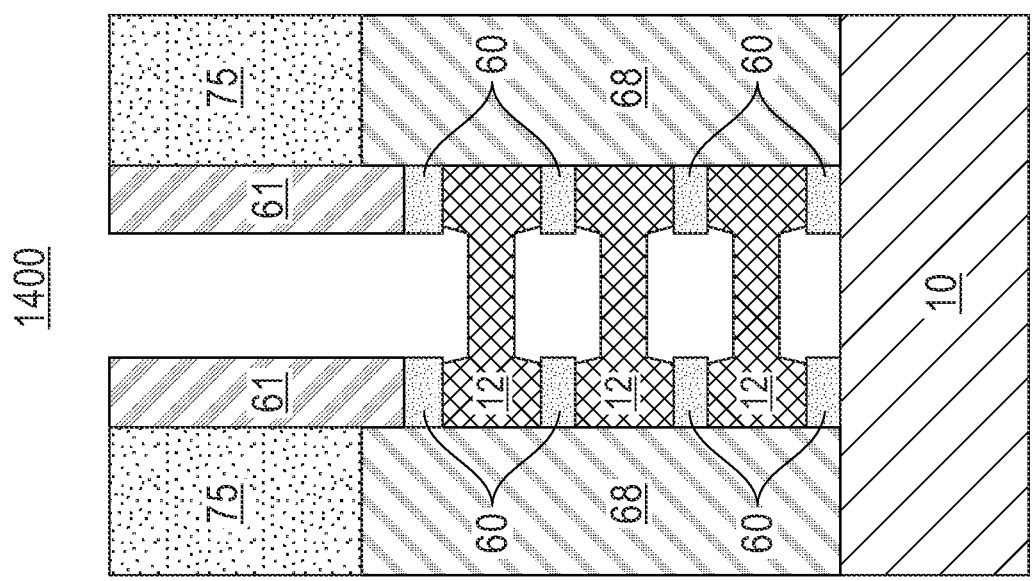
FIG. 14 depicts a cross-sectional view through the first direction in the precursor structure of the NFET hGAA device in the semiconductor structure after depositing and patterning an optical planarization layer and trimming exposed portions of the channel material, in accordance with an embodiment of the present invention.

FIG. 14 depicts cross-sectional view 1400 through the first direction in the precursor structure of the NFET hGAA device in the semiconductor structure after forming a masking layer over the PFET region using softmask 80 (not depicted in FIG. 14) and trimming exposed portions of channel material 12 in the precursor structure of the NFET hGAA device, in accordance with an embodiment of the present invention. As depicted, FIG. 14 includes the elements of FIG. 10 but with thinner remaining portions of channel material 12 in what will become the channel region of the completed NFET hGAA device. A layer of softmask 80 (e.g., an optical planarization layer or OPL) is deposited and patterned to expose channel material 12 in the NFET region. Softmask 80 can be used as an etch mask protecting the precursor structure of the PFET hGAA device. For example, a selective Si etching process, such as isotropic wet or dry etch process trims exposed portions of channel material 12 in the NFET channel region. Portions of the top and bottom surfaces of channel material 12 exposed in the channel area are removed. After etching channel material 12, the thickness of the remaining portions of channel material 12 in the NFET channel region are in the range of 4 to 8 nm but are not limited to this range.

Figure 15:
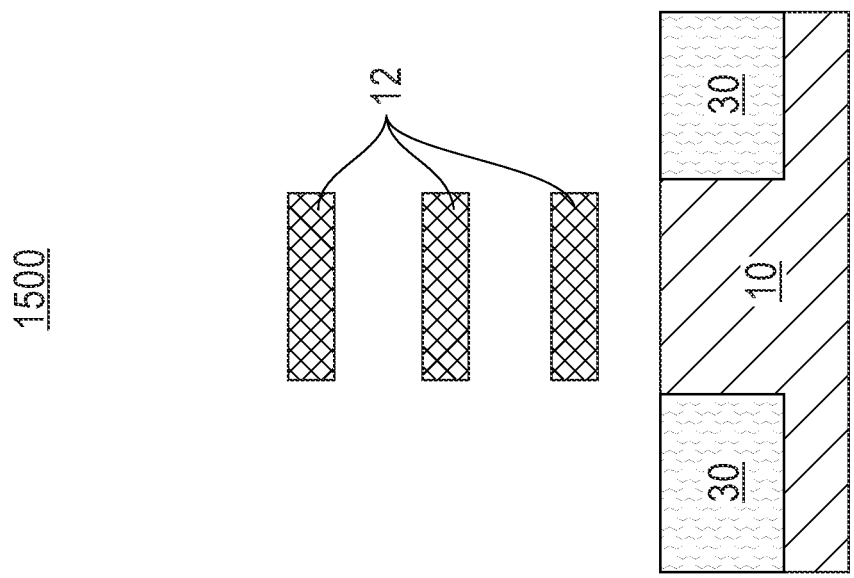
FIG. 15 depicts a cross-sectional view through the second direction in the precursor structure of the NFET hGAA device in the semiconductor structure after depositing and patterning an optical planarization layer and trimming exposed portions of the channel material, in accordance with an embodiment of the present invention.

FIG. 15 depicts cross-sectional view 1500 through the second direction in the precursor structure of the NFET hGAA device in the semiconductor structure after depositing and patterning softmask 80 (not depicted in FIG. 14) and trimming exposed portions of channel material 12 in the precursor structure of the NFET hGAA device, in accordance with an embodiment of the present invention. As depicted, FIG. 15, includes the elements of FIG. 11 but the remaining portions of channel material 12 are thinner after trimming as depicted in FIG. 15. The thickness of channel material 12 in FIG. 15 is the same as the thickness of the remaining portions of channel material 12 exposed and trimmed in FIG. 14.

Figure 16:
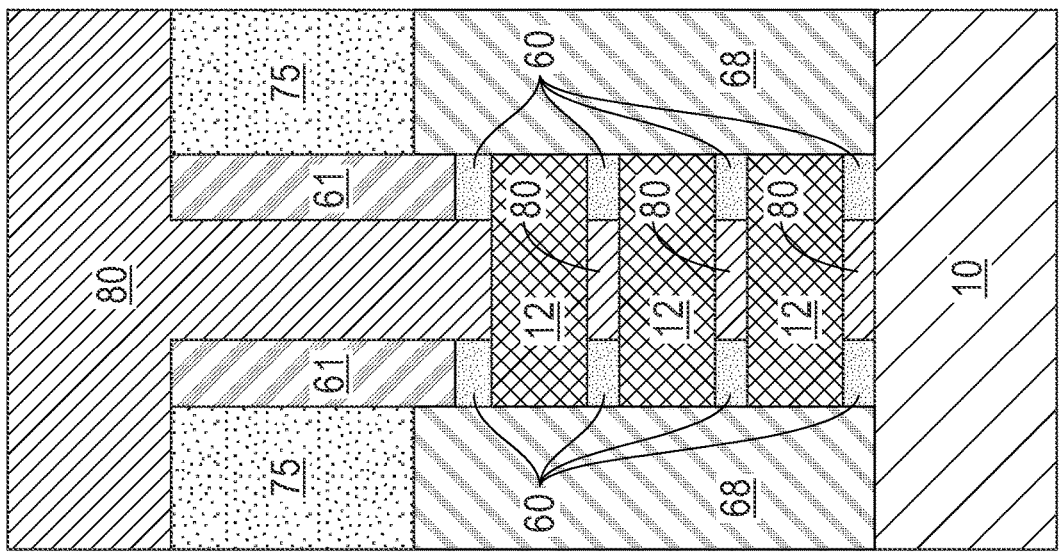
FIG. 16 depicts a cross-sectional view through the first direction in the precursor structure of the PFET hGAA device in the semiconductor structure after depositing and patterning an optical planarization layer and trimming exposed portions of the channel material, in accordance with an embodiment of the present invention.

FIG. 16 depicts cross-sectional view 1600 through the first direction in the precursor structure of the PFET hGAA device in the semiconductor structure after depositing and patterning softmask 80 and trimming exposed portions of channel material 12 in the precursor structure of the NFET hGAA device (not depicted in FIG. 16), in accordance with an embodiment of the present invention. As depicted, FIG. 16 includes the elements of FIG. 12 and softmask 80 over ILD 75, protective spacer 61, outside edges of inner spacer 60, and channel material 12. Softmask 80 protects the precursor structure of the PFET hGAA device from the etching process. The thickness of channel material 12 in the PFET device remains the same as it is depicted in FIGS. 12 and 13. For example, the vertical thickness of channel material 12 in FIG. 16 can range from 8 to 25 nm but is not limited to this range of thicknesses (e.g., the vertical thickness of channel material 12 is the same as the deposited or grown thickness in FIG. 1).

Figure 17:
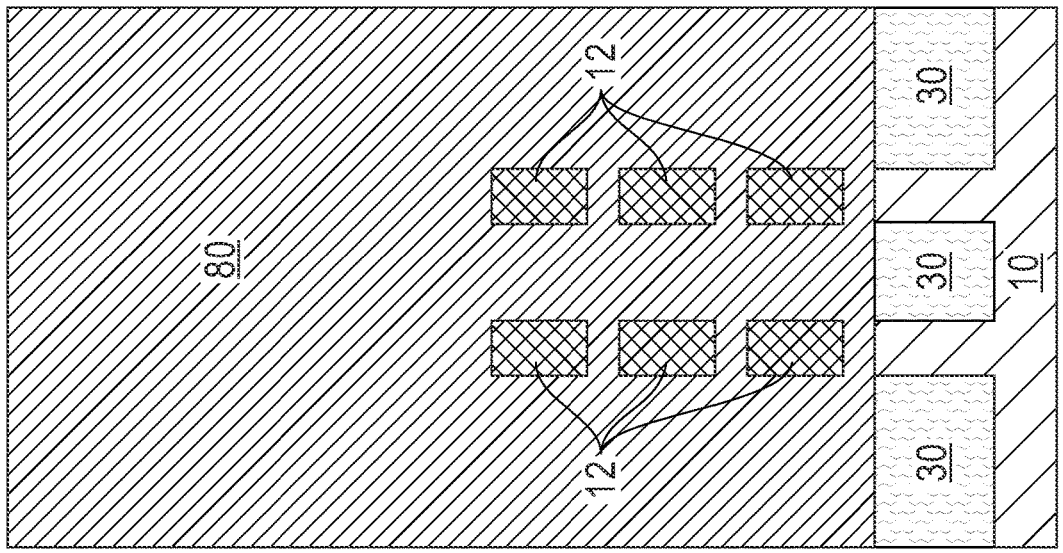
FIG. 17 depicts a cross-sectional view through the second direction in the precursor structure of the PFET hGAA device in the semiconductor structure after depositing and patterning an optical planarization layer and trimming exposed portions of the channel material, in accordance with an embodiment of the present invention.

FIG. 17 depicts cross-sectional view 1700 through the second direction in the precursor structure of the PFET hGAA device in the semiconductor structure after depositing and patterning softmask 80 and trimming exposed portions of channel material 12 in the precursor structure of the NFET hGAA device (not depicted in FIG. 17), in accordance with an embodiment of the present invention. As depicted, FIG. 17 includes the elements of FIG. 13 and softmask 80.

FIGS. 18, 19, 20 and 21 depict the cross-sectional views in the first direction or the X-direction and the second direction or the Y-direction of the NFET active regions (FIGS. 18 and 19) and the PFET active regions (FIGS. 20 and 21) after softmask 80 is removed and forming the replacement gate stack 90 which includes a high-k gate dielectric, work function metals, and conductive gate metals.

Figure 18:
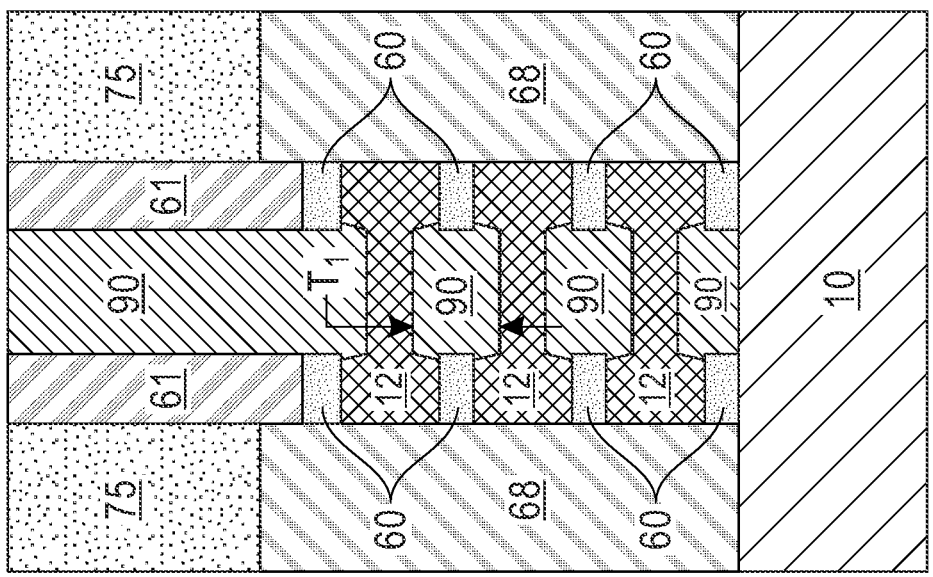
FIG. 18 depicts a cross-sectional view through the first direction in the precursor structure of the NFET hGAA device in the semiconductor structure after forming a metal replacement gate, in accordance with an embodiment of the present invention.

FIG. 18 depicts cross-sectional view 1800 through the first direction in the precursor structure of the NFET hGAA device in the semiconductor structure after forming replacement gate stack 90, in accordance with an embodiment of the present invention. As depicted, FIG. 18 includes the elements of FIG. 14 and replacement gate stack 90. In some embodiments, replacement gate stack 90 includes a high k gate dielectric (not depicted) and a conductive gate metal (not depicted) which also may be known as a work function metal or additional conductive metal. In some embodiments, replacement gate stack 90 can be known as a metal gate. The high k gate dielectric may be deposited on and around protective spacer 61, and exposed surfaces of inner spacer 60, channel material 12, and substrate 10 using known gate dielectric deposition processes, such as CVD, ALD, or the like. The gate dielectric may be a thin film of one $SiO_2$, SiON, SiOCN, boron nitride, or a high k dielectric material (e.g., HfO, HfSi, AlO, ZrO, TaO, etc.) but is not limited to these materials. The conductive gate metal or work function metal for the gate electrode in replacement gate stack 90 may include but is not limited to TiN, TiAl, TiC, TiAlC, TaN, Ta, Al, W, or Ru. The work function metal in replacement gate stack 90 may be deposited using CVD, PVD, ALD, or another suitable deposition process.

After the deposition of replacement gate stack 90, the thickness of replacement gate stack 90 between the channel regions of the NFET hGAA device is thicker than replacement gate stack 90 between the channel region of the PFET hGAA device depicted later in FIG. 20 (T1>T2). The thickness of replacement gate stack 90 can range from 2 to 20 nm. The thickness of replacement gate stack 90 may also be known as a channel suspension thickness. As depicted in FIG. 18 and later in FIG. 19, the remaining portions of channel material 12 are have a horizontal orientation where the larger horizontal dimension of each portion of channel material is large than the vertical dimension of channel material 12. In FIG. 18, the outer edges of each portion of channel material 12 are thicker than the center portion of channel material 12 that is between replacement gate stack 90.

Figure 19:
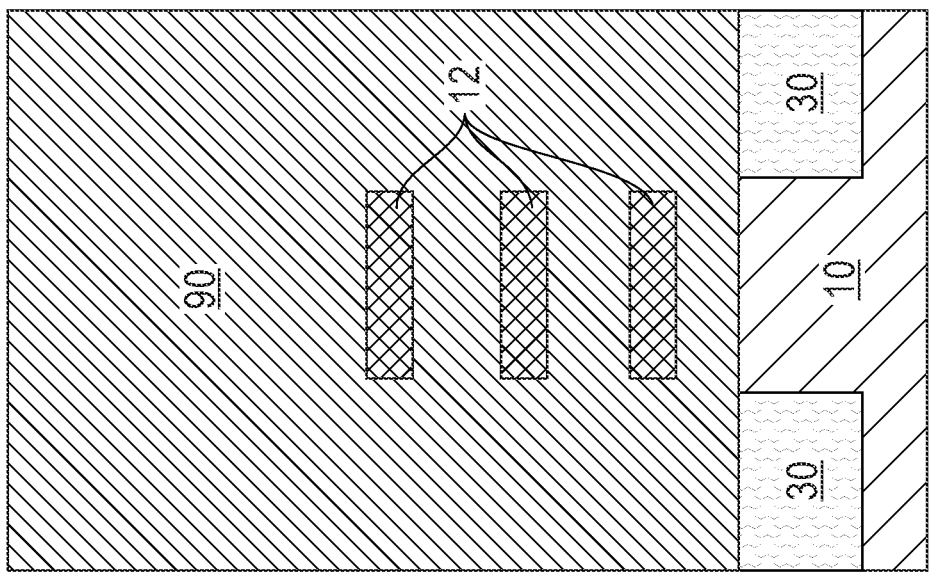
FIG. 19 depicts a cross-sectional view through the second direction in the precursor structure of the NFET hGAA device in the semiconductor structure after forming the metal replacement gate, in accordance with an embodiment of the present invention.

FIG. 19 depicts cross-sectional view 1900 through the second direction in the precursor structure of the NFET hGAA device in the semiconductor structure after forming replacement gate stack 90, in accordance with an embodiment of the present invention. As depicted, FIG. 19 includes the elements of FIG. 15 and replacement gate stack 90. FIG. 19 is formed using the processes and materials discussed in detail above with reference to FIG. 18. As depicted in FIG. 19, the space between the remaining portions of trimmed channel material 12 in the NFET hGAA device is larger than the space between the portions of as formed channel material 12 in the PFET hGAA device. In other words, as described above with respect to FIG. 18, the replacement gate stack 90 material thickness, which can also be known as the channel suspension thickness, between the remaining portions of channel material 12 in the NFET hGAA cross-sectional view 1900, is thicker than the channel suspension thickness or replacement gate stack 90 thickness in cross-sectional view 2100 depicted later for the PFET hGAA device.

Figure 20:
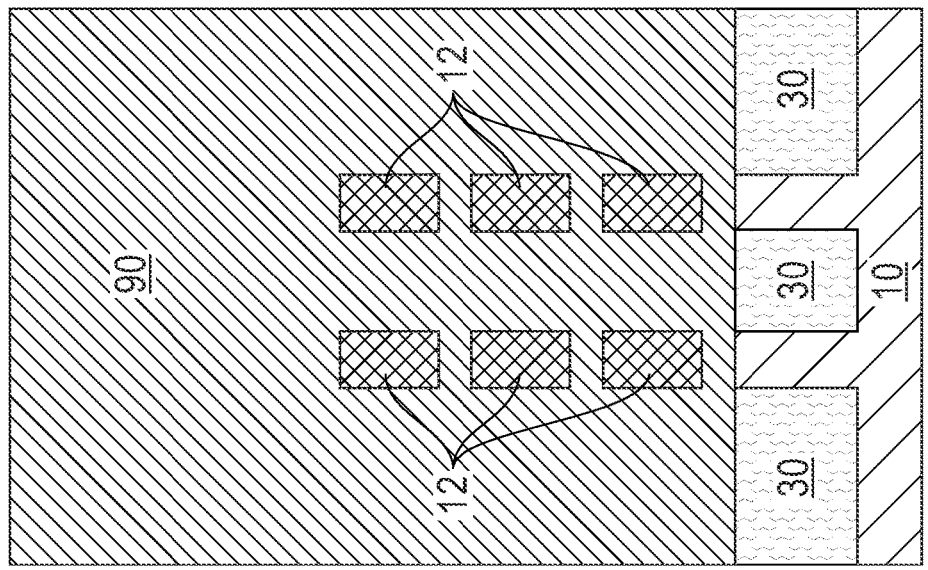
FIG. 20 depicts a cross-sectional view through the first direction in the precursor structure of the PFET hGAA device in the semiconductor structure after forming the metal replacement gate, in accordance with an embodiment of the present invention.

FIG. 20 depicts across-sectional view 2000 through the first direction in the precursor structure of the PFET hGAA device in the semiconductor structure after forming replacement gate stack 90, in accordance with an embodiment of the present invention. As depicted, FIG. 20 includes the elements of FIG. 18 and replacement gate stack 90. As depicted, the channel suspension thickness of replacement gate stack 90 is thinner in the PFET hGAA device depicted in FIG. 20 than the channel suspension thickness (replacement gate stack 90 material) in the NFET hGAA device depicted in FIG. 18. Additionally, the vertical thickness of channel material 12 in FIG. 20 is greater than the vertical thickness of channel material 12 in FIG. 18 (i.e., the NFET hGAA device). Cross-sectional view 2000 is formed using the processes and materials discussed above with reference to FIG. 18.

Figure 21:
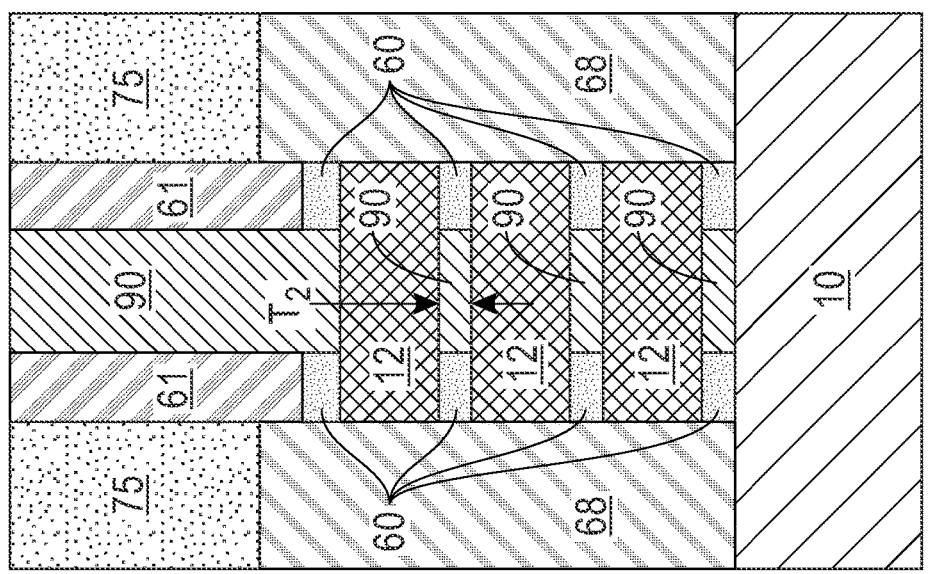
FIG. 21 depicts a cross-sectional view through the second direction in the precursor structure of the NFET hGAA device in the semiconductor structure after forming the metal replacement gate, in accordance with an embodiment of the present invention.

FIG. 21 depicts cross-sectional view 2100 through the second direction in the precursor structure of the PFET hGAA device in the semiconductor structure after forming replacement gate stack 90, in accordance with an embodiment of the present invention. As depicted, FIG. 21 includes the elements of FIG. 19 and replacement gate stack 90. As depicted, the channel suspension thickness (e.g., the thickness of replacement gate stack 90 materials between channel material 12) is thinner in the PFET hGAA device depicted in FIG. 21 than the channel suspension thickness of replacement gate stack 90 between channel material 12 in the NFET hGAA device depicted in FIG. 19. The channel suspension thickness between channel material 12 with the vertical nano-ellipse shape is approximately the as-deposited thickness of sacrificial layer 11 in FIG. 1 (e.g., may range from 2 to 20 nm). While FIG. 21 depicted three vertical nano-ellipse shaped portions in two vertical columns with a vertical space ranging from 2 to 20 nm between each of the nano-ellipse shaped portions in other examples, more than three portions of the vertical nano-ellipse shaped portions of channel material 12 may be present in one or more columns of channel material 12.

Additionally, as previously discussed, in the PFET hGAA device depicted in FIG. 21, the remaining portions of channel material 12 form two narrow columns of channel material 12, where the individual portions of channel material 12 have the vertical nano-ellipse shape previously discussed with respect to FIG. 5. While two narrow columns of channel material 12 are depicted in FIG. 21, in other embodiments, one or more narrow columns of channel material 12 are formed. The horizontal width of each of the remaining portions of channel material 12 has the desired horizontal channel width (e.g., in the range of 4 to 8 nm). In the PFET nGAA device, the current travels through channel material 12 between the vertical sidewalls of vertical nano-ellipse shaped portions of channel material 12. The vertical thickness of channel material 12 in FIG. 21 is greater than the vertical thickness of the center region of channel material 12 in FIG. 19 (i.e., the NFET hGAA device). The vertical thickness of channel material 12 can be the same as the as-deposited thickness of channel material 12 in the nanosheet stack depicted in FIG. 1. Cross-sectional view 2100 is formed using the processes and materials discussed above with reference to FIG. 20. As depicted in FIG. 21, the horizontal dimension of channel material 12 is smaller than the vertical dimension of channel material 12.

As depicted in FIG. 18 and FIG. 21, the active channel width in the NFET hGAA device in FIG. 18 is approximately the same as the active channel width in the PFET hGAA device in FIG. 21. The active channel width in the NFET hGAA device is the vertical width or thickness of the center area of channel material 12 that is between or abutting replacement gate stack 90 and the active channel width of the PFET hGAA device is the horizontal width of the vertical nano-ellipse shaped portions of channel material 12. As known to one skilled in the art, the semiconductor chip can be completed using known middle of the line (MOL) and back end of the line (BEOL) processes, such as contact and interconnect formation.

Figure 22:
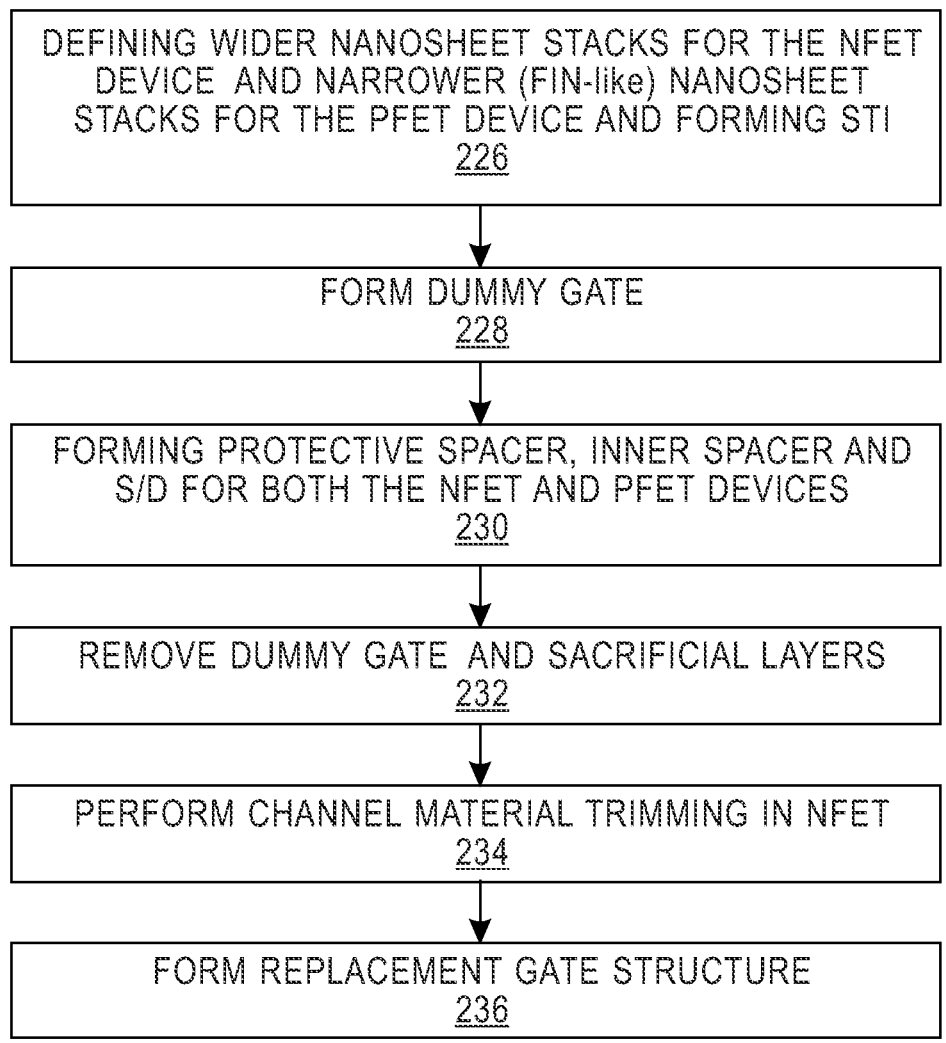
FIG. 22 is an example of a flow chart depicting an example of some of the processes for forming the NFET hGAA device and the PFET hGAA device with the same channel width from a nanosheet stack, in accordance with an embodiment of the present invention.

FIG. 22 is an example of a flow chart depicting an example of some of the processes for forming the NFET hGAA device and the PFET hGAA device with the same channel width from a nanosheet stack, in accordance with an embodiment of the present invention. The two hGAA devices formed include an NFET hGAA device formed simultaneously with a PFET hGAA device. The flowchart is a generalized process flow and may not include all the processes used in forming the two hGAA devices.

In step 226, the method includes defining wider nanosheet stacks for the NFET hGAA device and narrower (fin-like) nanosheet stacks for the PFET hGAA device and forming one or more STI. The method includes growing the nanosheet layers, for example, using epitaxy. Alternating nanosheet layers of a sacrificial material, such as SiGe and a channel material, such as silicon can be epitaxially grown on a semiconductor substrate to form a nanosheet stack of alternating layers of the sacrificial material and the channel material.

The method includes selectively etching portions of the nanosheet stack and the semiconductor substrate using known lithography and etching processes, such as photolithography or EUV lithography and RIE, for example. After selectively etching the nanosheet stack, two narrow columns of the remaining nanosheet stack remain in the PFET device region and a single, wider column of the remaining nanosheet stack remains in the NFET device region on the semiconductor substrate. The method includes depositing a shallow trench isolation material, such as $SiO_2$ to form STIs in the removed portions of the semiconductor substrate.

In step 228, the method includes depositing a dummy gate structure. The dummy gate structure can be formed over the remaining top layer of the sacrificial material. A protective spacer may be formed around the dummy gate and a hardmask deposited on the dummy gate.

In step 230, the method includes forming a protective spacer, inner spacers, and S/D for both the NFET hGAA device and the PFET hGAA device. The method includes recessing the sacrificial material. A lateral etching process removes the exposed outer edge portions of the sacrificial material creating divots or horizontal recesses. The method includes depositing inner spacers in the horizontal recesses. The inner spacers can be deposited using known deposition processes in the divots or recessed areas between the layers of the channel material after the outside portions of the sacrificial material were removed. The method includes growing the source/drains. The source/drain grown by epitaxy may include device appropriate doping (e.g., doping with an n-type dopant, such as antimony, arsenic, and phosphorous or a p-type dopant such as boron, aluminum, gallium, or indium). The source/drains are grown on the semiconductor substrate directly adjacent to and abutting the outside edges of the channel material, the inner spacers, and a bottom portion of the protective spacer around the dummy gate.

In step 232, the method includes removing the dummy gate and the sacrificial layers using one or more etching processes. After the etching processes, the channel material is exposed in the center portion of the remaining nanosheet stack.

In step 234, the method includes trimming the exposed portions of the channel material in the precursor structure of the NFET hGAA device. Using a wet or dry etching process, the exposed top and bottom surfaces of the channel material may be removed in the NFET hGAA device. The selective etching of the channel material in the NFET hGAA device provides the desired channel width where the channel width is the vertical thickness of the remaining center portions of the trimmed channel material.

In step 236, the method includes depositing the replacement gate structure. The replacement gate structure may include a gate metal or work function metal deposited over a gate dielectric material. The thickness of the replacement gate structure between the remaining center portions of the channel material in the precursor structure of the NFET hGAA device is greater than the thickness of the replacement gate structure in the precursor structure of the PFET hGAA device. In some embodiments, the thickness of the deposited replacement gate materials between the channel materials is known as the channel suspension thickness. Additionally, in the final PFET hGAA device, the channel material forms two narrow columns of vertical nano-ellipse shaped channel material.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

The methods, as described herein, can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure comprising:
   a first device with a first plurality of channels with a larger horizontal dimension than a vertical dimension of the first plurality of channels; and
   a second device comprising a second plurality of channels with a smaller horizontal dimension than a vertical dimension of the second plurality of channels, wherein:
   the vertical dimension of the second plurality of channels is greater than the vertical dimension of the first plurality of channels; and
   the first plurality of channels and the second plurality of channels are stacked according to an equal number of channels.

2. The semiconductor structure of claim 1, wherein the first plurality of channels and the second plurality of channels have a same channel width.

3. The semiconductor structure of claim 1, wherein:
   the first plurality of channels are composed of horizontal portions of a plurality of nanosheet layers of a channel material;
   a first vertical spacing separates each channel of the first plurality of channels;
   each of the first plurality of channels in a center region of each of the horizontal portions of the plurality nanosheet layers of the channel material has a thinner vertical width than a vertical width of the plurality of second channels; and
   the first vertical spacing is greater than a second vertical spacing separating each channel of the second plurality of channels.

4. The semiconductor structure of claim 1, wherein the first device is an n-type horizontal gate-all-around field-effect transistor device.

5. The semiconductor structure of claim 3, wherein:
the second plurality of channels are composed of a plurality of portions of nanosheets of a channel material;
the plurality of portions of the nanosheets of the channel material form one or more columns of the channel material; and
each portion of the nanosheets of the channel material has a vertical nano-ellipse shape with a horizontal width that is a same horizontal width as the vertical dimension of the first plurality of channels.

6. The semiconductor structure of claim 1, wherein the second device is a p-type horizontal gate-all-around field-effect transistor device.

7. The semiconductor structure of claim 4, wherein the second plurality of channels provides a channel surface orientation (110) as a dominant channel surface orientation.

8. The semiconductor structure of claim 2, further comprising:
in a cross-section view through a gate structure, a semiconductor substrate;
a portion of the gate structure on a portion of the semiconductor substrate, wherein a plurality of portions of the gate structure reside between the first plurality of channels and a plurality of portions of the gate structure reside between the second channels;
a plurality of inner spacers abutting each vertical edge of each of the plurality of portions of the gate structure;
a protective spacer surrounding a top portion of each of the plurality of portions of the gate structure; and
a doped source/drain abutting outside exposed edges of each of the plurality of inner spacers and outer edges of the first plurality of channels and outer edges of the second plurality of channels, wherein the doped source/drain abutting the first plurality of channels is doped with an n-type dopant and the source/drain abutting the second plurality of channels is doped with a p-type dopant.

9. The semiconductor structure of claim 1, wherein the first plurality of channels each have a vertical width in a center region of each of the first plurality of channels that is a same width as a horizontal width of each of the second plurality of channels.

10. The semiconductor structure of claim 9, wherein the vertical width in a center of each of the first plurality of channels and the horizontal width of each of the second plurality of channels is between four to eight nanometers.

11. A method comprising:
growing alternating nanosheet layers of a sacrificial material and a channel material in a nanosheet stack on a substrate;
selectively etching portions of the nanosheet stack and the substrate to form a wider column of remaining portions of the nanosheet stack for an n-type device and at least one narrower column of remaining portions of the nanosheet stack for a p-type device;
forming more than one shallow trench isolation in the substrate;
forming a dummy gate around and above each of remaining portions of a plurality of channel nanosheet layers in the more than one remaining portions of the nanosheet stack for both the n-type device and the p-type device;
forming a protective spacer around a top portion of the dummy gate;
forming an inner spacer abutting a remaining portion of each of a plurality of sacrificial nanosheet layers in the remaining portions of the nanosheet stack;
growing source/drains abutting outer edges of the remaining portions of the nanosheet stack and the inner spacers for both the n-type device and the p-type device;
removing the dummy gates and each of the remaining portions of a plurality of sacrificial nanosheets in the nanosheet stack;
depositing and patterning a softmask over the p-type device;
selectively trimming each of remaining portions of the plurality of the channel nanosheet layers exposed in the remaining portions of the nanosheet stack in only the n-type device;
removing the softmask; and
forming a metal replacement gate around and above each of the remaining portions of the plurality of channel nanosheet layers and abutting vertical sides of each inner spacer for both the n-type device and the p-type device, wherein the n-type device forms an n-type field-effect transistor horizontal gate-all-around device and the p-type device forms a p-type field-effect transistor horizontal gate-all-around device.

12. The method of claim 11, wherein selectively trimming each of remaining portions of the plurality of the channel nanosheet layers exposed in the remaining portions of the nanosheet stack in only the n-type device further comprises removing a portion of a top surface and a bottom surface of each remaining portions of the plurality of the channel nanosheet layers to a channel width.

13. The method of claim 11, wherein selectively etching portions of the nanosheet stack and the substrate to form the at least one narrower column of the remaining portions of the nanosheet stack for the p-type device provides a channel width in a horizontal width of the channel material in each of the remaining portions of the nanosheet stack.

14. The method of claim 13, wherein the p-type device provides the channel width in the horizontal width of the channel material and a vertical channel material thickness provides the channel width for the n-type device.

15. The method of claim 11, wherein selectively trimming each of remaining portions of the plurality of the channel nanosheet layers exposed in the remaining portions of the nanosheet stack in only the n-type device creates a larger space between each of the remaining portions of the plurality of channel nanosheet layers than a space between the remaining portions of the plurality of channel nanosheet layers in the at least one narrower column of the remaining portions of the nanosheet stack for the p-type device.

16. The method of claim 11, wherein forming the inner spacer further comprises laterally etching outer edges of a plurality of portions of sacrificial nanosheet layers in the remaining portions of the nanosheet stack.

17. The method of claim 11, wherein growing source/drains abutting outer edges of the remaining portions of the nanosheet stack and the inner spacers for both the n-type device and the p-type device includes using epitaxy and doping the source/drains with a dopant selected from the group consisting of an n-type dopant and a p-type dopant.

18. The method of claim 11, wherein growing alternating the nanosheet layers of the sacrificial material and the channel material in the nanosheet stack on the substrate, further comprises:

using epitaxy to grow a layer of silicon germanium on the substrate for a first nanosheet layer of the sacrificial material; and using epitaxy to grow a layer of silicon on the layer of silicon germanium for a first nanosheet layer of the channel material, wherein the layer of silicon is thicker than the layer of silicon germanium.

\* \* \* \* \*